(12) United States Patent
Sakata et al.

(10) Patent No.: US 8,484,840 B2
(45) Date of Patent: Jul. 16, 2013

(54) LEADING WIRING METHOD, LEADING WIRING PROGRAM, AND LEADING WIRING APPARATUS

(75) Inventors: Toshiyasu Sakata, Kawasaki (JP); Eiichi Konno, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 782 days.

(21) Appl. No.: 12/659,697

(22) Filed: Mar. 17, 2010

(65) Prior Publication Data

US 2010/0170083 A1  Jul. 8, 2010

Related U.S. Application Data

(63) Continuation of application No. PCT/JP2007/068086, filed on Sep. 18, 2007.

(51) Int. Cl.
*H01R 43/00* (2006.01)
*H05K 13/00* (2006.01)

(52) U.S. Cl.
USPC ............ 29/854; 29/831; 29/832; 29/842; 29/846; 29/852; 156/233; 156/289; 156/272.2; 156/273.3; 156/275.5; 174/254; 174/255; 174/256; 174/259; 716/15; 716/126; 716/137

(58) Field of Classification Search
USPC ............ 29/593, 831, 832, 842, 846, 852, 29/854, 866; 156/233, 272.2, 273.3, 275.5, 156/289, 344; 174/254, 255, 256, 259; 716/15, 716/126, 137
See application file for complete search history.

(56) References Cited

U.S. PATENT DOCUMENTS

| | | | |
|---|---|---|---|
| 5,812,413 A | 9/1998 | Matsushita | |
| 5,847,968 A | 12/1998 | Miura et al. | |
| 6,915,497 B2 * | 7/2005 | Kitahara | ......... 716/113 |
| 7,289,008 B2 * | 10/2007 | Kuroki et al. | ......... 333/133 |
| 7,519,927 B1 * | 4/2009 | Hryckowian et al. | ......... 716/100 |
| 7,647,576 B2 * | 1/2010 | Ikeda | ......... 716/55 |
| 8,037,596 B2 * | 10/2011 | Muramatsu et al. | ......... 29/846 |
| 8,222,532 B2 * | 7/2012 | Muramatsu et al. | ......... 174/255 |
| 2006/0089736 A1 | 4/2006 | Kazuta et al. | |

FOREIGN PATENT DOCUMENTS

| | | |
|---|---|---|
| JP | 5-266143 | 10/1993 |
| JP | 7-282092 | 10/1995 |
| JP | 8-227428 | 9/1996 |
| JP | 10-134098 | 5/1998 |

(Continued)

OTHER PUBLICATIONS

International Search Report for PCT/JP2007/068086, mailed on Oct. 16, 2007.

*Primary Examiner* — Paul D Kim
(74) *Attorney, Agent, or Firm* — Staas & Halsey LLP

(57) ABSTRACT

When a formed position of a via formed on a board is the same as a position of a footprint of a chip component located on the back surface of the board corresponding to an area on which a BGA is mounted, a board designing apparatus determines that the chip component and the BGA can be connected using chip on hole. When it is determined that the chip component and the BGA can be connected, the board designing apparatus carries out chip on hole by forming a via in an area of the board on which the BGA is mounted, the via leading to the footprint of the chip component located on the back surface of the board.

15 Claims, 13 Drawing Sheets

FOREIGN PATENT DOCUMENTS

| | | |
|---|---|---|
| JP | 2002-270992 | 9/2002 |
| JP | 2002-334124 | 11/2002 |
| JP | 2006-11684 | 1/2006 |
| JP | 2006-94448 | 4/2006 |

* cited by examiner

SAME-NET
COMPONENT
TERMINAL

LEADING WIRING METHOD, LEADING WIRING PROGRAM, AND LEADING WIRING APPARATUS

CROSS-REFERENCE TO RELATED APPLICATION(S)

This application is a continuation of International Application No. PCT/JP2007/068086, filed on Sep. 18, 2007, the entire contents of which are incorporated herein by reference.

FIELD

The embodiments discussed herein are directed to a leading wiring method causing a computer to execute leading wiring for electrical components arranged on a multilayer printed wiring board.

BACKGROUND

There has been proposed a conventional technology for reducing wiring design worker-hours of a multilayer printed wiring board on which arranged are surface-mounted components, which are packaged using methods such as BGA (Ball Grid Array), QFP (Quad Flat Package), and SOP (Small Outline Package) (hereinafter, these components are referred to as "BGA", "QFP", and "SFP" as needed) (e.g., see Japanese Laid-open Patent Publication No. 2006-11684).

For example, when a designer carries out, on a multilayer printed wiring board, wiring design for connecting a BGA located on the surface of a board and a bypass capacitor located on the back surface of the board, the designer checks whether the board permits the use of Chip On Hole (COH). When the board permits the use of COH, the designer makes a via that leads from the surface of the board to the bypass capacitor on the back surface of the board and then carries out leading wiring from the BGA on the surface of the board to the via, so that the BGA and the bypass capacitor are connected through a via.

When it turns out that the board does not permit the use of COH as a result of checking whether the board in use permits the use of COH, the designer makes vias, leading to an inner layer of the board, near the BGA and the bypass capacitor, and then carries out leading wiring from the BGA to the bypass capacitor, so that the BGA and the bypass capacitor are connected through the vias.

There is a problem with the conventional technology in that it requires a huge amount of operation time. A designer carries out leading wiring for connecting the surface-mounted component with the bypass capacitor by forming a via by trial and error, e.g., checks whether using COH on the board is allowed, which results in a large amount of operation time.

Further, when the designer carries out different leading wiring for connecting the surface-mounted component with a signal pin after preferentially carrying out leading wiring for connecting the surface-mounted component with the bypass capacitor by trial and error, a situation sometimes arises where the designer cannot carry out the different leading wiring for connecting the surface-mounted component with the signal pin. In case of such a situation, the designer needs to start over the operation by correcting the wired parts and carrying out leading wiring without overlooking any wiring. This start-over is a primary factor in the increase in the operation time.

With the further advancement in signal speed transmitting among semiconductor integrated circuits, not only a bypass capacitor but also a damping resistor may be located on the back surface of the board. Therefore, it may be preferable that COH be used, if possible, so that the wiring space of the back surface of the board can be effectively used.

The present invention is made in order to solve the above-mentioned problems with the conventional technology. An object of the present invention is to provide a leading wiring method, a leading wiring program, and a leading wiring apparatus that prevent the start-over of the operation and shorten the operation time of leading wiring considerably.

SUMMARY

According to an aspect of an embodiment of the invention, a leading wiring apparatus includes a shape determining unit that determines, based on wiring board information, whether each of surface-mounted components located on a surface of a multilayer printed wiring board has a predetermined shape; a connection determining unit that, for the surface-mounted components that are determined as having the predetermined shape, identifies a position of each via formed on the multilayer printed wiring board and a position of a footprint of each chip component located on a back surface of the board, and then determines whether each chip component and each surface-mounted component of the predetermined shape can be connected using chip on hole; and a connection executing unit that, for the surface-mounted components and chip components that are determined as ones that can be connected using chip on hole, carries out leading wiring from the vias, formed leading to the footprint, to terminals of the surface-mounted components so that the terminals of the surface-mounted components and the chip components are connected using chip on hole.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENT(S)

Preferred embodiments of the present invention will be explained with reference to accompanying drawings. In the description below, as one exemplary embodiment of the leading wiring method in accordance with the present invention, a board designing apparatus that carries out the leading wiring method is described as a first embodiment. Later, other exemplary embodiments within the scope of the present invention are described as other embodiments.

[a] First Embodiment

In a first embodiment below, an outline and features of a board designing apparatus in accordance with the first embodiment are described in turn, and an effect of the first embodiment is described last.

Outline and Features of Printed-Board Designing Apparatus (First Embodiment)

The outline and features of the board designing apparatus are described with reference to FIGS. 1 to 4. FIGS. 1 to 4 are diagrams illustrating the outline and features of the board designing apparatus in accordance with the first embodiment.

The outline of the board designing apparatus in accordance with the first embodiment is that the board designing apparatus stores wiring board information that is related to a multilayer printed wiring board in a storage unit and then carries out leading wiring of electrical components that are arranged on the multilayer printed wiring board with use of the wiring board information stored in the storage unit. The main feature of board designing apparatus in accordance with the first embodiment is that the board designing apparatus can prevent the start-over of the process, and thereby shortening the operation time of the leading wiring considerably.

Specifically, the main feature is that the board designing apparatus in accordance with the first embodiment determines, on the basis of the wiring board information, whether the surface-mounted components located on the surface of the board have a predetermined shape, i.e., whether these components are a BGA.

When it is determined that the surface-mounted components are a BGA, the board designing apparatus in accordance with the first embodiment identifies a formed position of a via, which is formed in an area of the board on which the BGA is mounted and a position of a footprint of each chip component, which is located on the back surface of the board corresponding to the area of the board on which the BGA is mounted, and then determines whether the chip component can be connected with the BGA using chip on hole.

Specifically, when the formed position of the via, which is formed on the board, is the same as the position of the footprint of the chip component, which is located on the back surface of the board corresponding to the area of the board on which the BGA is mounted, the board designing apparatus in accordance with the first embodiment determines that the chip component can be connected with the BGA using chip on hole.

Figure 2:
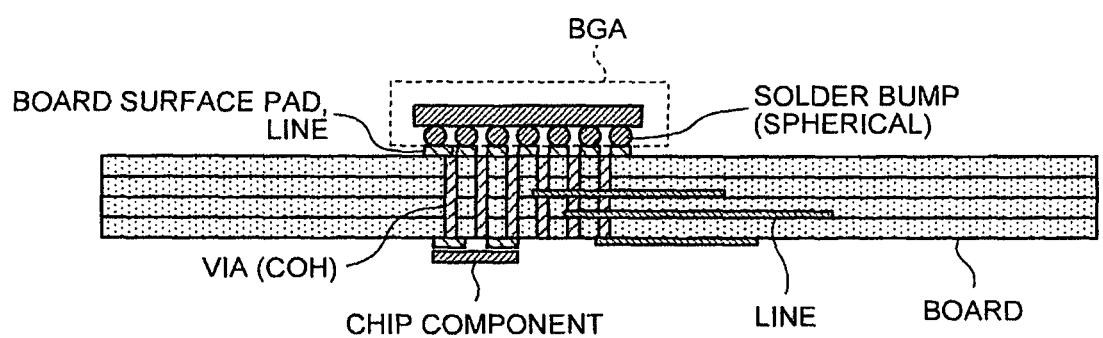
FIGS. 2 to 4 are diagrams illustrating an outline and features of a board designing apparatus in accordance with the first embodiment.

When it is determined that the chip component can be connected with the BGA using chip on hole, the board designing apparatus in accordance with the first embodiment carries out chip on hole and forms the via leading to the footprint of the chip component located on the back surface of the board, for example, as illustrated in FIG. 2.

After correcting the position of chip on hole as needed, the board designing apparatus in accordance with the first embodiment carries out leading wiring from the via formed using chip on hole to the BGA terminal, thereby connecting the BGA with the chip component using chip on hole.

Figure 3:
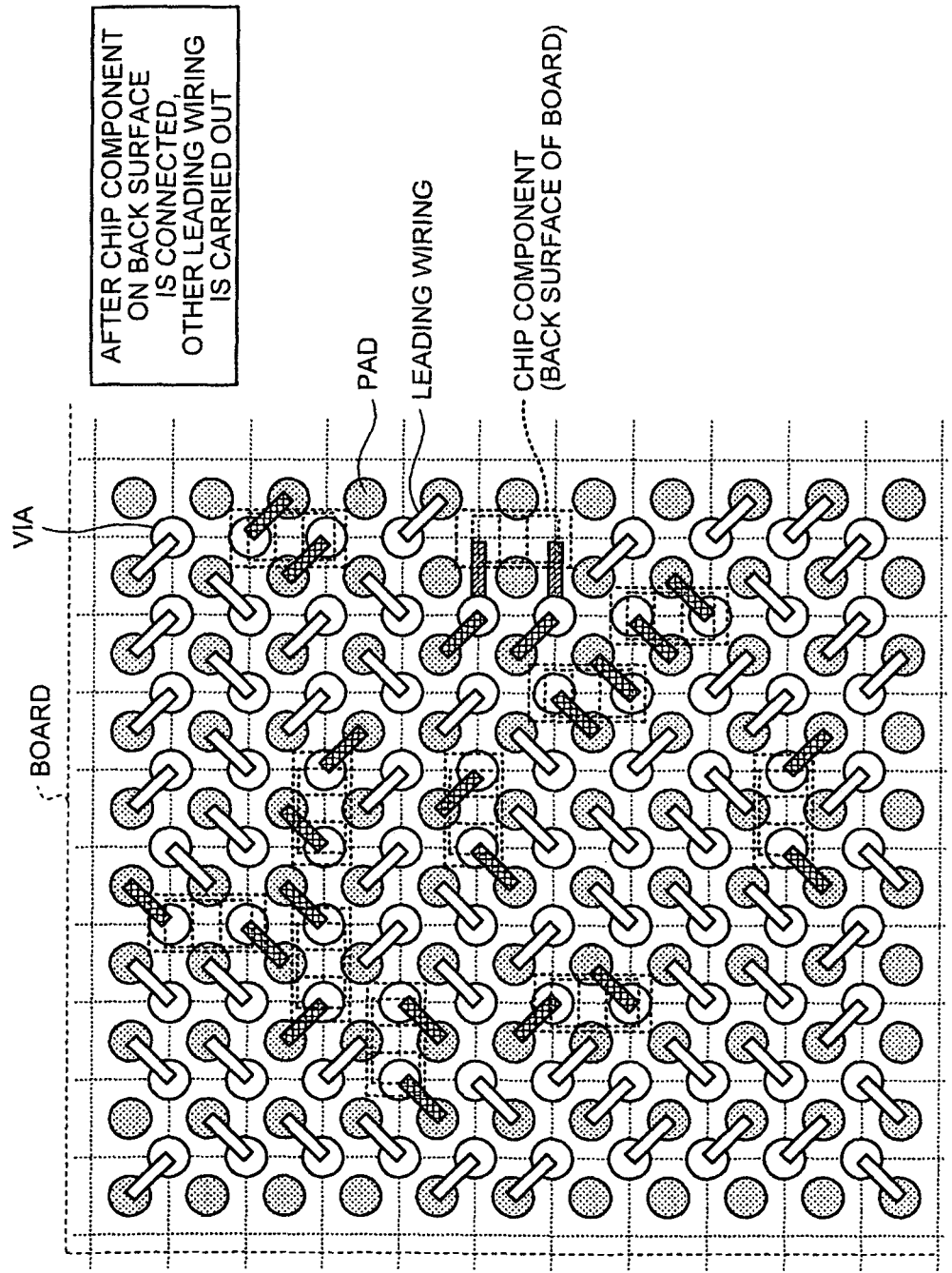
Figure 4:
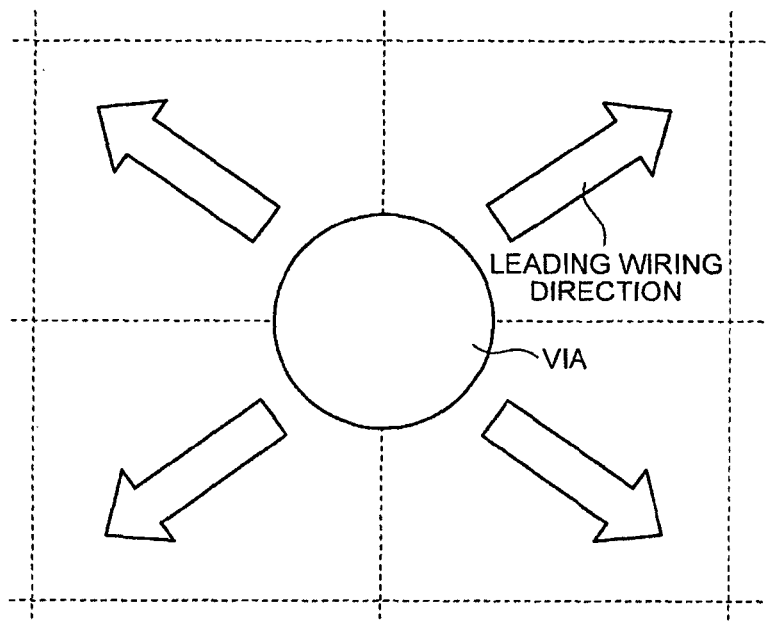

After the connection with the chip components is completed, the board designing apparatus in accordance with the first embodiment carries out the rest of leading wiring as illustrated in FIG. 3. Specifically, as illustrated in FIG. 4, the board designing apparatus determines the combinations of leading directions for carrying out, without overlooking any combination, leading wiring from the vias formed in the area of the board on which the BGA is mounted to the remaining BGA terminals and then carries out the leading wiring to other terminals on the basis of determined combinations.

As such, the board designing apparatus in accordance with the first embodiment can prevent the start-over of the process, thereby shortening the operation time of leading wiring considerably.

Configuration of Printed-Board Designing Apparatus (First Embodiment)

Figure 5:
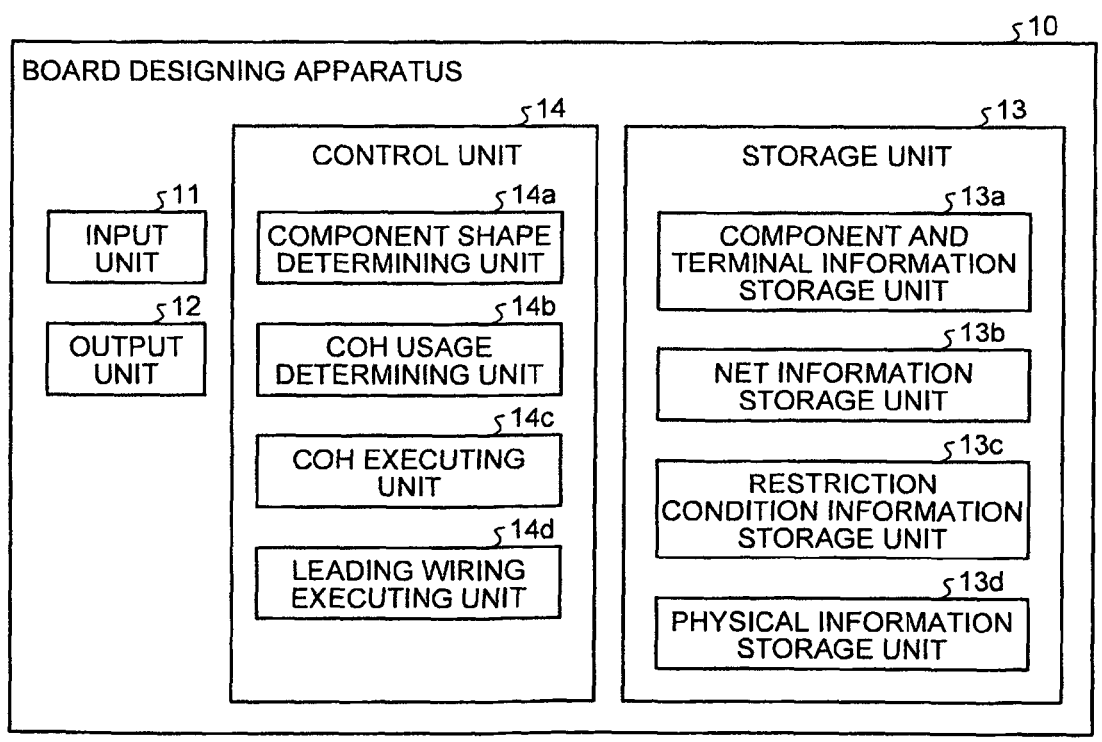
FIG. 5 is a block diagram illustrating a configuration of a board designing apparatus in accordance with the first embodiment.
Figure 6:
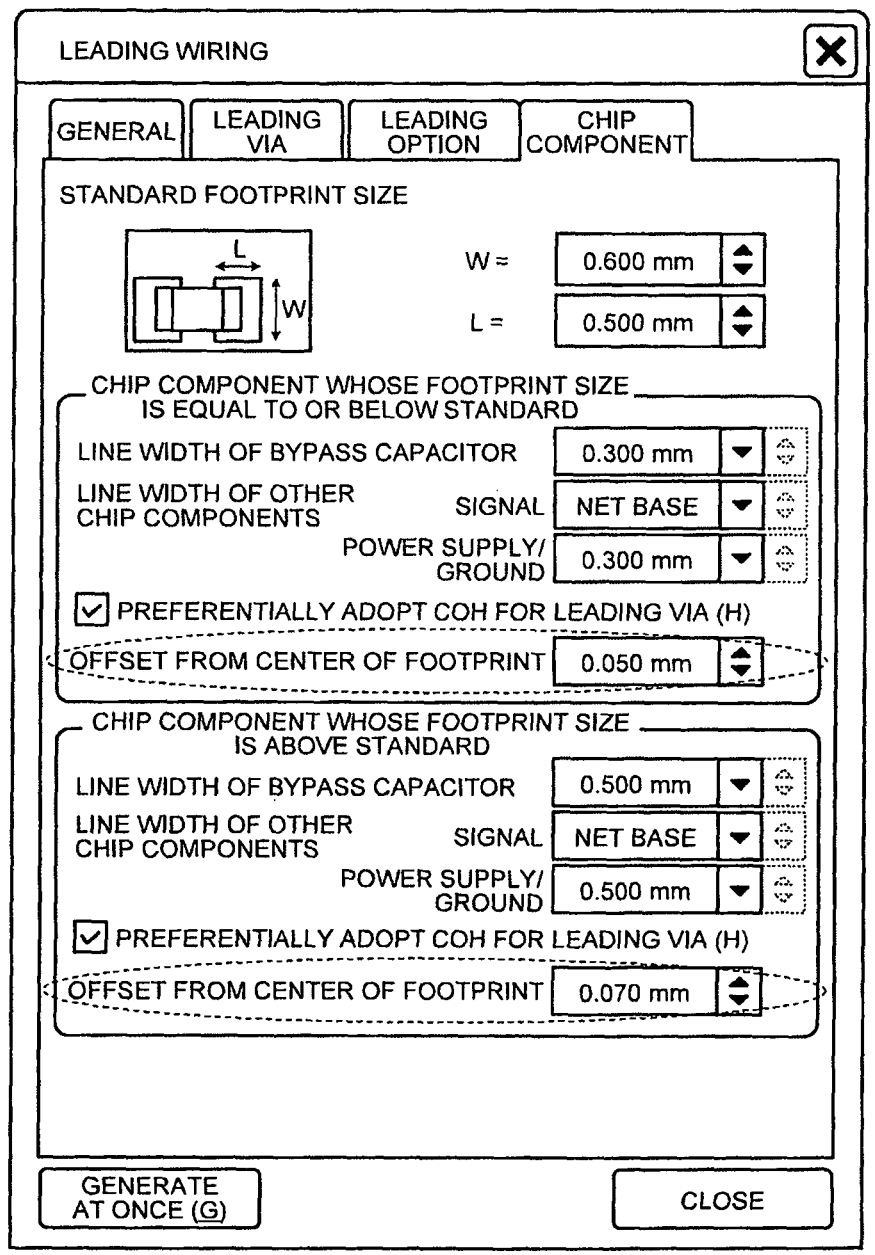
FIG. 6 is a diagram illustrating an exemplary screen configuration for inputting position correction instructions for chip on hole.
Figure 7:
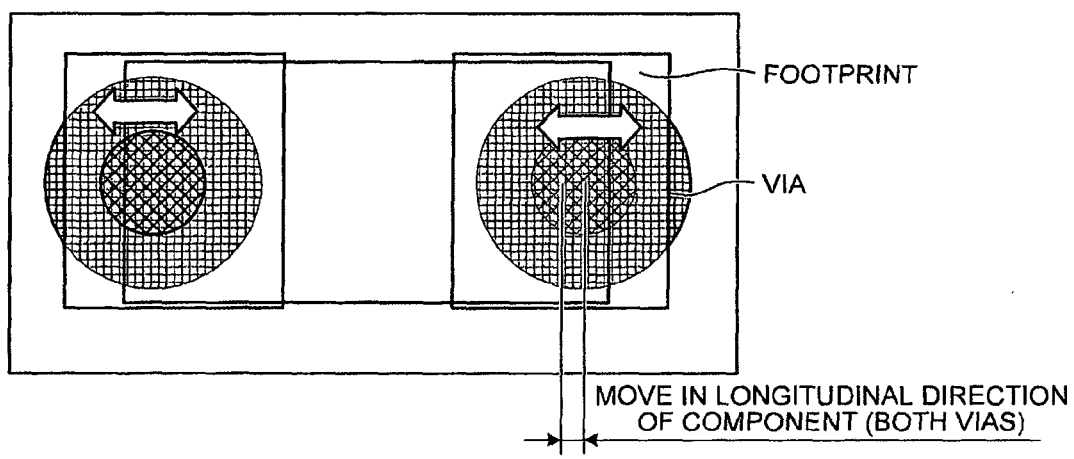
FIG. 7 is a diagram illustrating an exemplary position correction for chip on hole.

The configuration of the board designing apparatus in accordance with the first embodiment is described with reference to FIGS. 5 to 7. FIG. 5 is a block diagram illustrating the configuration of the board designing apparatus in accordance with the first embodiment. FIG. 6 is a diagram illustrating an exemplary screen configuration for inputting position correction instructions for chip on hole. FIG. 7 is a diagram illustrating an exemplary position correction for chip on hole.

As illustrated in FIG. 5, a board designing apparatus 10 in accordance with the first embodiment includes an input unit 11, an output unit 12, a storage unit 13, and a control unit 14.

The input unit 11 can include, for example, a keyboard, a mouse, and a microphone and receive various kinds of information. For example, the input unit 11 receives a position correction instruction for chip on hole from a user. When the output unit 12 described later is a monitor, the input unit 11 provides a pointing device function that is synchronous with the mouse.

The output unit 12 can include, for example, a monitor (or a display or a touch panel) and a speaker and output various kinds of information. For example, the output unit 12 outputs the result of chip on hole to be displayed in a way users can view.

The storage unit 13 is a storage unit that stores data and programs related to wiring board information needed for various kinds of processes performed by the control unit 14. Particularly, in close relation with the present invention, the storage unit 13 includes a component and terminal information storage unit 13a, a net information storage unit 13b, a restriction condition information storage unit 13c, and a physical information storage unit 13d. The information stored in the component and terminal information storage unit 13a, the net information storage unit 13b, the restriction condition information storage unit 13c, the physical information storage unit 13d may be referred to as "wiring board information".

The component and terminal information storage unit 13a stores various kinds of information such as information on position coordinates of components, information related to the shape of components such as BGA, QFP, and SOP, and information related to terminal attributes.

The net information storage unit 13b stores various kind of information such as information related to terminal lists among wiring regions, and information related to net attributes such as line width, signal type, and analog/digital flag.

The restriction condition information storage unit 13c stores various kinds of information such as information on groups of components that needs to be instructed to be located nearby.

The physical information storage unit 13d stores various kinds of information such as information on board shape, number of layers, and forbidden areas, information on shapes of devices such as vias, components, and terminals, and information on values indicating physical space among vias.

The control unit 14 is a processing unit that includes an internal memory for storing predetermined control programs, programs defining various kinds of procedures, and required data, and executes various kinds of processes using these programs and data. Particularly, in close relation with the present invention, the control unit 14 includes a component shape determining unit 14a, a COH usage determining unit 14b, a COH executing unit 14c, and a leading wiring executing unit 14d.

The component shape determining unit 14a is a processing unit that determines whether each surface-mounted component located on the surface of the multilayer printed wiring board has a predetermined shape. Specifically, the component shape determining unit 14a reads information related to the component shape stored in the component and terminal information storage unit 13a and then determines, based on the read information related to the component shape, whether each surface-mounted component located on the surface of the multilayer printed wiring board is a BGA or is a QFP or SOP instead of BGA.

When the result of determination of the surface-mounted component is a BGA, the component shape determining unit 14a sends the result of determination indicating a BGA to the COH usage determining unit 14b in order to perform a COH usage determining process. When the result of determination is a QFP or SOP instead of BGA, the component shape determining unit 14a sends the result of determination indicating a QFP or SOP instead of BGA to the leading wiring executing unit 14d in order to perform corresponding component processes of QFP or SOP.

The COH usage determining unit 14b is a processing unit that identifies a position of a via, which is formed in an area of the board on which the BGA is mounted, and a position of a footprint of each chip component, which is located on the back surface of the board on which the BGA is mounted, and then determines whether each chip component can be connected with the BGA using chip on hole (COH).

Figure 1:
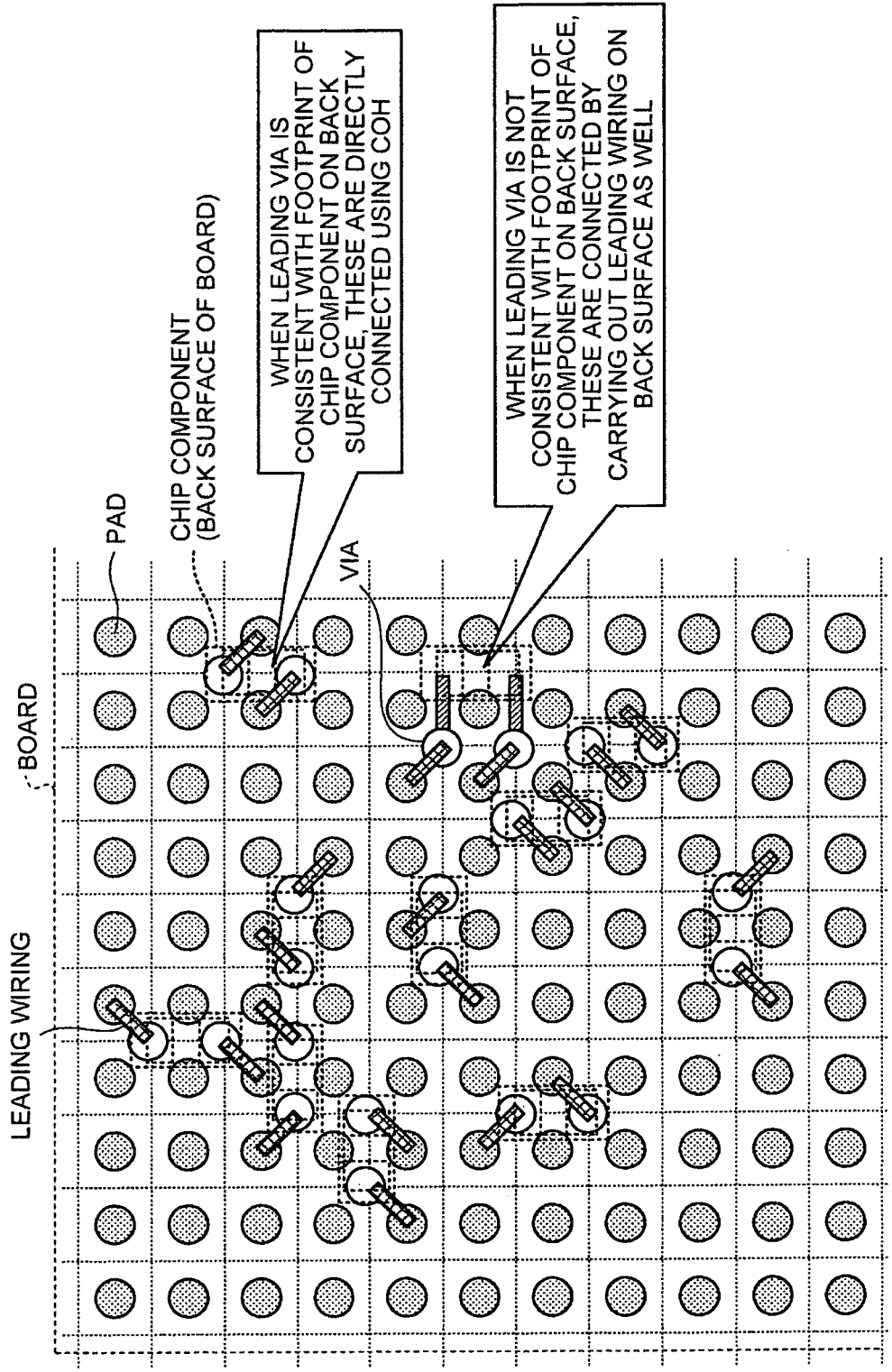
FIG. 1 is a diagram illustrating an outline and features of a board designing apparatus in accordance with a first embodiment.

Specifically, when the formed position of a via formed on the board is the same as the position of the footprint of the chip component located on the back surface of the board corresponding to the area of the board on which the BGA is mounted, the COH usage determining unit 14b determines that the chip component and the BGA can be connected using chip on hole (see FIG. 1). Then, the COH usage determining unit 14b sends information related to the formed position of via and the chip component to the COH executing unit 14c.

In contrast, when the COH usage determining unit 14b determines that the chip component and the BGA cannot be connected using chip on hole, the COH usage determining unit 14b sends information related to the formed position of the via and the footprint of the chip component to the leading wiring executing unit 14d.

The COH executing unit 14c is a processing unit that carries out chip on hole to connect the BGA and the chip component together. Specifically, the COH executing unit 14c carries out chip on hole by forming a via in an area of the board on which the BGA is mounted, the via leading to the footprint of the chip component located on the back surface of the board (see FIG. 2).

The COH executing unit 14c outputs a result of carrying out chip on hole to the output unit 12 so that the result is displayed in a way that a user can view the result. Then, the COH executing unit 14c waits for an input instruction from the user. This helps when the via for carrying out chip on hole is formed in an incorrect position due to manufacturing conditions or the like and the position of the via needs to be corrected into a correct position.

The user first confirms the result of carrying out chip on hole that is output and displayed by the output unit 12. Then, when the position of chip on hole needs to be corrected, the user launches a screen illustrated in FIG. 6 and controls the input unit 11 and sets an offset by inputting the offset as the position correction instruction, for example, in a manner such that the center of the footprint of the chip component is the same as the center of chip on hole. In contrast, when the position of chip on hole does not need to be corrected, the user inputs a confirmation that there will be no correction instruction for the result of carrying out chip on hole.

When the position correction instruction on chip on hole is received from the user, the COH executing unit 14c corrects the position of chip on hole by moving the via in the longitudinal direction of the component according to the position correction direction as illustrated in FIG. 7 for example, and then carries out leading wiring from the via formed using chip on hole to the BGA terminal, so that the BGA and the chip component are connected using chip on hole. When the confirmation indicating that there will be no correction instruction for the result of carrying out chip on hole, the COH executing unit 14c connects the BGA and the chip component together using chip on hole as they are.

The leading wiring executing unit 14d is a processing unit that carries out leading wiring. Specifically, after the BGA and the chip component are connected by the COH executing unit 14c using chip on hole, the leading wiring executing unit 14d determines the combinations of wiring directions for carrying out, without overlooking any combination, leading wiring from the vias formed in the area of the board on which the BGA is mounted to the remaining BGA terminals and then carries out the remaining leading wiring based on the determined combinations.

Further, when information related to the formed position of via and the footprint of chip component, which are determined as those that cannot be connected using chip on hole, is received from the COH usage determining unit 14b, the leading wiring executing unit 14d carries out leading wiring from the BGA terminals and the chip component terminals to the vias, so that the BGA and the chip component are connected together.

When the result of determination indicating that the surface-mounted component is a QFP or SOP instead of BGA is received from the component shape determining unit 14a, the leading wiring executing unit 14d carries out corresponding component processes described in the later embodiments.

Processes of Printed-board Designing Apparatus (First Embodiment)

Figure 8:
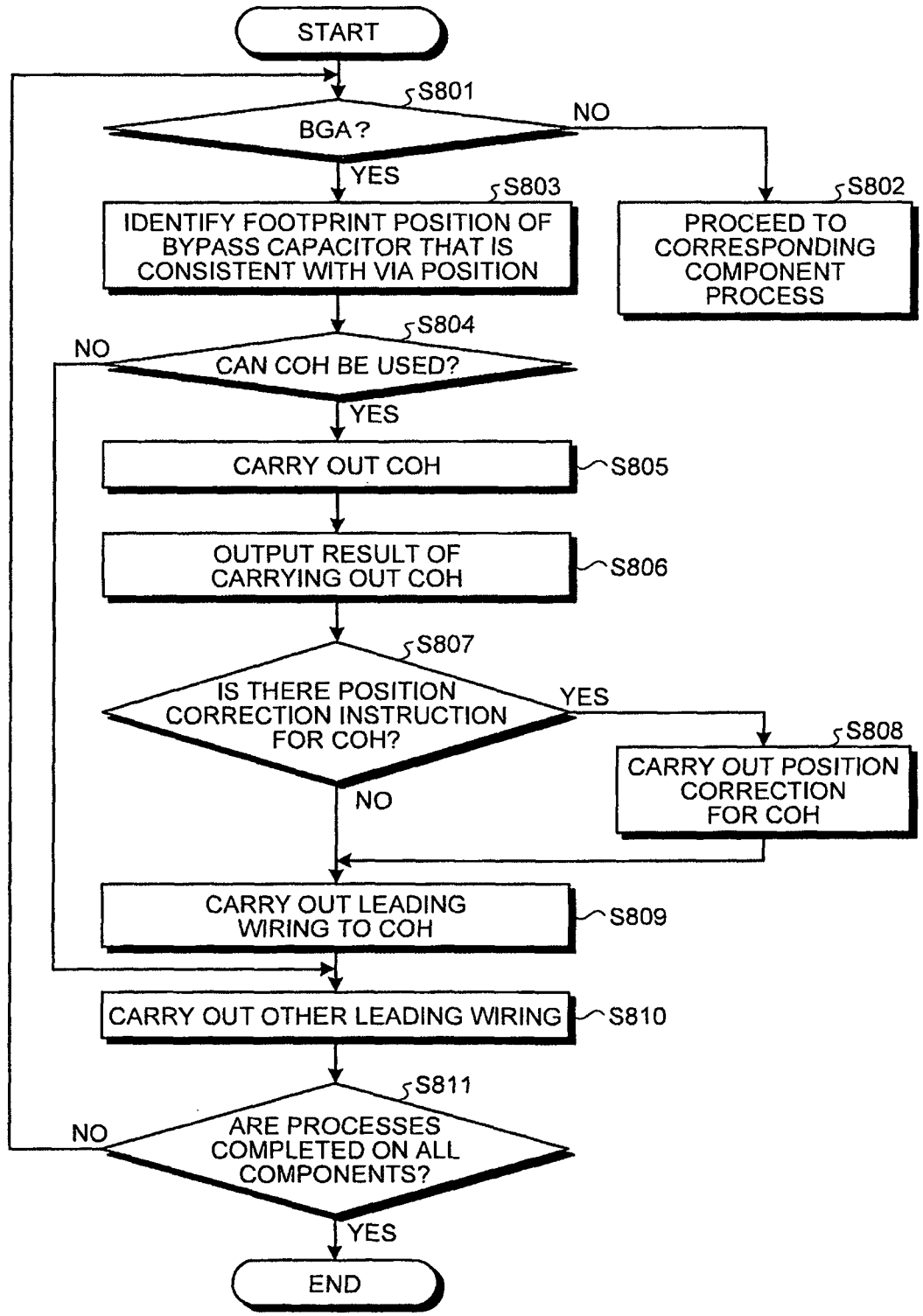
FIG. 8 is a flowchart illustrating a flow of processes of a board designing apparatus in accordance with the first embodiment.
Figure 9:
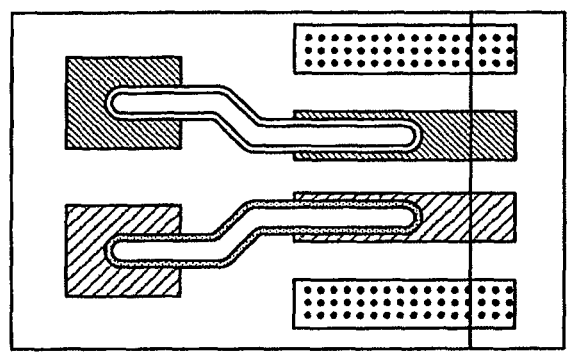
FIGS. 9 to 15 are diagrams illustrating a leading wiring process of a board designing apparatus in accordance with a second embodiment.
Figure 10:
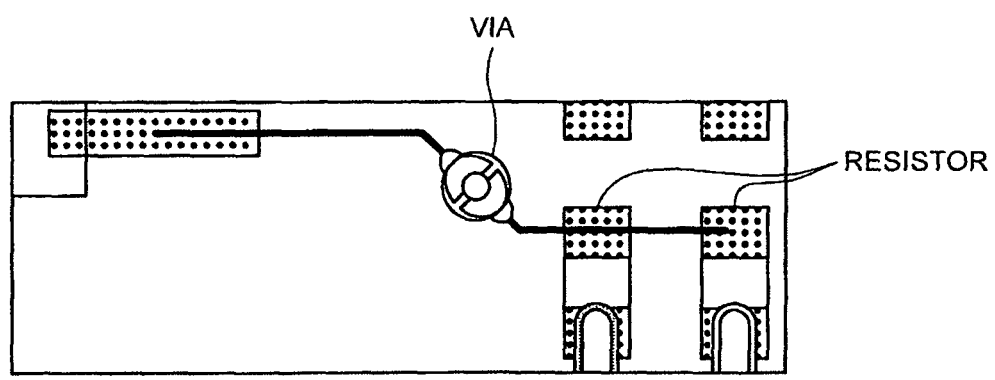

Processes of a board designing apparatus in accordance with the first embodiment are described with reference to FIG. 8. FIG. 8 is a flowchart indicating a flow of processes of the board designing apparatus in accordance with the first embodiment.

As illustrated in FIG. 8, the component shape determining unit 14a reads information related to the component shape stored in the component and terminal information storage unit 13a and then determines, based on the read information related to the component shape, whether each surface-mounted component located on the surface of the multilayer printed wiring board is a BGA or is a QFP or SOP instead of BGA (Step S801).

When the result of determination of the surface-mounted component is a BGA (Step S801: Yes), the component shape determining unit 14a sends the result of determination indicating BGA to the COH usage determining unit 14b so that the COH usage determining unit carries out the COH usage determination process. In contrast, when the result of determination is a QFP or SOP instead of BGA, the component shape determining unit 14a sends the result of determination indicating a QFP or SOP instead of BGA to the leading wiring executing unit 14d and then proceeds to the corresponding component processes of QFP or SOP (Step S802).

The COH usage determining unit 14b identifies a position of a via, which is formed in an area of the board on which the BGA is mounted, and a position of footprint of each chip component, which is located on the back surface of the board corresponding to an area on the board on which the BGA is mounted (Step S803)

The COH usage determining unit 14b identifies a position of a via, which is formed in an area of the board on which the BGA is mounted, and a position of footprint of each chip component, which is located on the back surface of the board corresponding to an area on the board on which the BGA is mounted. Then, the COH usage determining unit 14b determines whether each chip component and the BGA can be connected using chip on hole (COH) (Step S804). Specifically, when the formed position of via formed on the board is the same as the position of the footprint of chip component located on the back surface of the board corresponding to the area of the board on which the BGA is mounted, the COH usage determining unit 14b determines that the chip component and the BGA can be connected using chip on hole.

When it is determined that the chip component and BGA can be connected using chip on hole (Step S804: Yes), the COH usage determining unit 14b sends information related to the formed position of the via and the chip component to the COH executing unit 14c. When it is determined that the chip component and BGA cannot be connected using chip on hole (Step S804: No), the COH usage determining unit 14b sends information related to the formed position of via and the footprint of chip component to the leading wiring executing unit 14d and then proceeds to Step S810, which is described later.

When the information related to the formed position of via and the chip component that can be connected together using chip on hole is received from the COH usage determining unit 14b, the COH executing unit 14c carries out chip on hole to connect the BGA and chip component together (Step S805). Specifically, the COH executing unit 14c carries out chip on hole by forming a via in an area of the board on which the BGA is mounted, the via leading to the footprint of the chip component located on the back surface of the board.

After carrying out chip on hole, the COH executing unit 14c outputs the result of carrying out chip on hole to the output unit 12 so that the result is displayed in a way that users can view the result (Step S806). The COH executing unit 14c waits for an instruction that is input from a user (Step S807).

When the position correction instruction of chip on hole is received from the user, the COH executing unit 14c corrects the position of chip on hole by moving the via in the longitudinal direction of the chip component according to the position correction instruction (Step S808). The COH executing unit 14c carries out leading wiring from the via formed using chip on hole to the BGA terminal so that the BGA and the chip component are connected using chip on hole (Step S809).

In contrast, when a confirmation that there will be no correction instruction for the result of carrying out chip on hole is received from the user (Step S807: No), the BGA and the chip component are connected using chip on hole as they are (Step S809).

After the BGA and the chip component are connected by the COH executing unit 14c using chip on hole, the leading wiring executing unit 14d determines combinations of wiring directions for carrying out, without overlooking any combination, leading wiring from the vias formed in the area of the board on which the BGA is mounted to the remaining BGA terminals and then carries out the remaining leading wiring based on the determined combinations (Step S810).

Further, when information related to the formed position of via and the footprint of chip component, which are determined as those which cannot be connected using chip on hole, is received from the COH usage determining unit 14b, the leading wiring executing unit 14d carries out leading wiring from the BGA terminals and the chip component terminals to the vias, so that the BGA and the chip component are connected together.

The board designing apparatus 10 determines whether processes have been completed on all surface-mounted components. When the processes are completed on all components (Step S811: Yes), the board designing apparatus 10 terminates the process. When the processes are not completed on all components (Step S811: No), the board designing apparatus 10 continues the processes on the remaining components.

Effect of First Embodiment

As described above, the first embodiment provides an advantage in that the start-over of the process is prevented, and thus the operation time of leading wiring is shortened considerably.

Further, the first embodiment provides an advantage in that the position of a via can be corrected when the via happens to be formed at incorrect positions due to the manufacturing conditions or the like.

Further, the first embodiment provides an advantage that the leading wiring is carried out without overlooking any leading wiring.

[b] Second Embodiment

The following describes the corresponding component processes, which are performed for QFP or SOP in the first embodiment when the result of determination of the surface-mounted component is a QFP or SOP instead of BGA. A configuration and process of a board designing apparatus in accordance with a second embodiment are described below.

Configuration of Printed-Board Designing Apparatus (Second Embodiment)

A configuration of the board designing apparatus in accordance with the second embodiment is described with reference to FIGS. 9 to 15. FIGS. 9 to 15 illustrate the leading wiring process of the board designing apparatus in accordance with the second embodiment. Although the configuration of the board designing apparatus in accordance with the second embodiment is basically the same as the configuration of the board designing apparatus in accordance with the first embodiment, the processing function of the leading wiring executing unit 14d is different.

When the determination result indicating that the result of determination of the surface-mounted component is a QFP or SOP instead of BGA is received from the component shape determining unit 14a, the leading wiring executing unit 14d reads information stored in the component and terminal information storage unit 13a, the net information storage unit 13b, the restriction condition information storage unit 13c, and the physical information storage unit 13d of the storage unit 13 and then carries out the leading wiring process for each terminal of QFP and SOP.

Specifically, the leading wiring executing unit 14d determines, based on information on terminal attributes read from the component and terminal information storage unit 13a, whether the category of the component terminal of QFP or SOP is signal. For those component terminals which are determined, as a result of the determination, as ones whose category is signal, the leading wiring executing unit 14d determines, based on information related to net attributes read from the net information storage unit 13b, whether there is a same-net component nearby.

When there is a same-net component nearby, the leading wiring executing unit 14d determines, based on the information read from the physical information storage unit 13d, whether the component is a pull-up/pull-down resistor. When the component is not a pull-up/pull-down resistor as a result of the determination, the leading wiring is carried out among the component terminals for the direct connection (see FIG. 9). When the component is a pull-up/pull-down resistor, the leading wiring executing unit 14d sets a via on the resistor side and carries out leading wiring from each component terminal to the via (see FIG. 10).

Figure 11:
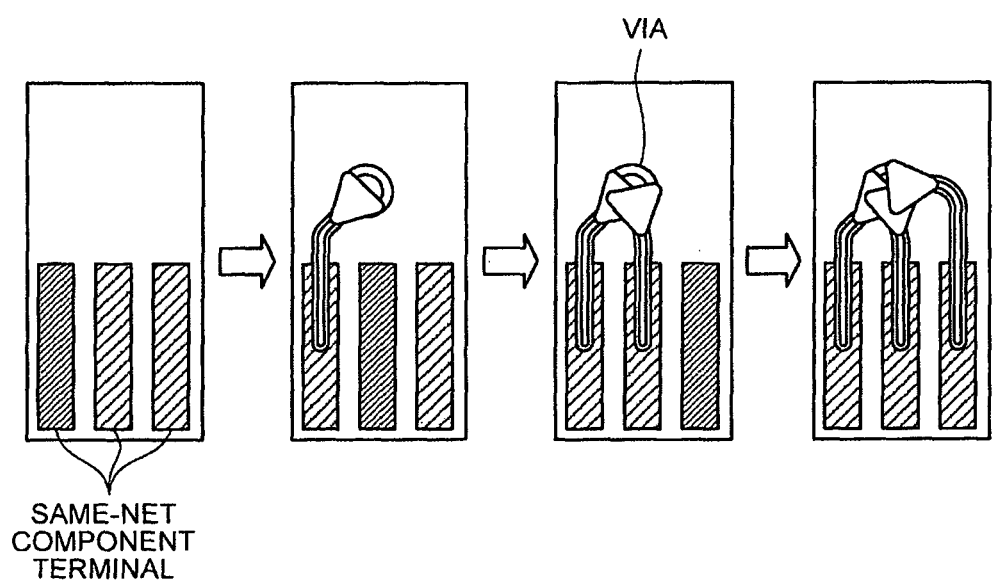
Figure 12:
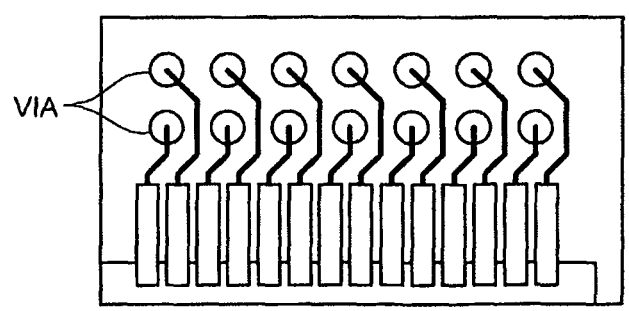
Figure 13:
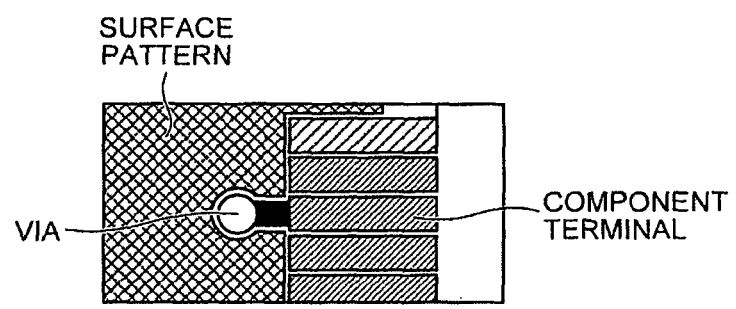
Figure 14:
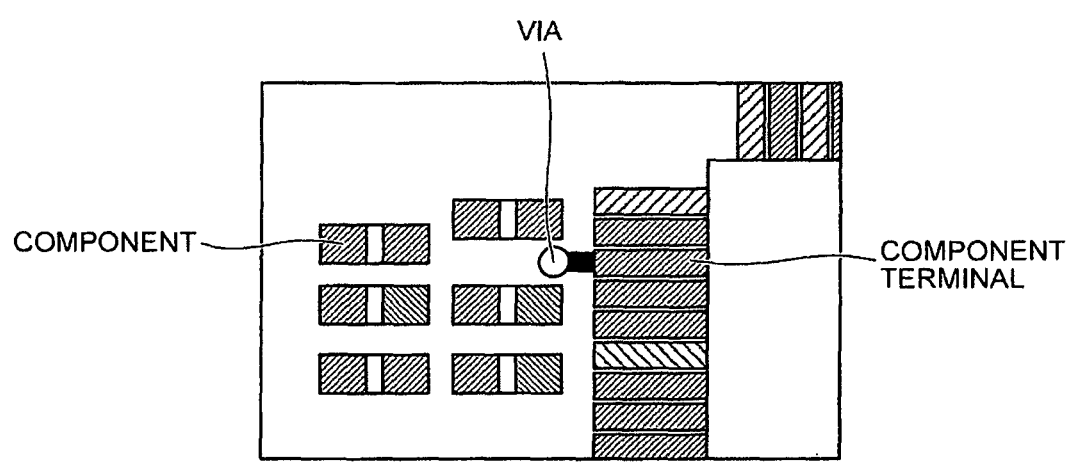
Figure 15:
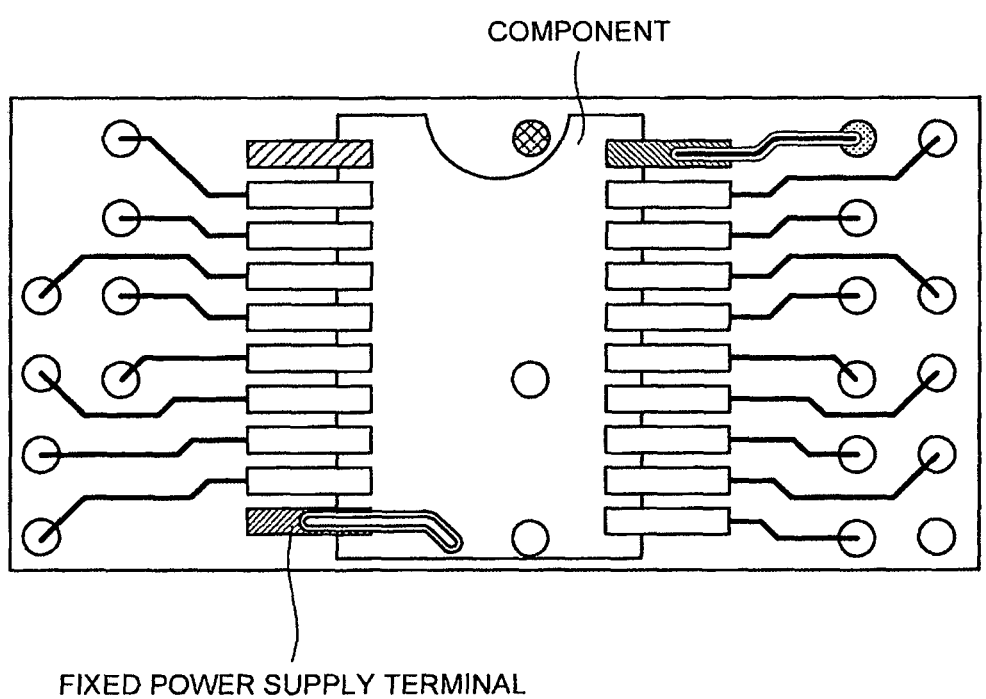

Further, when there is a same-net component nearby, the leading wiring executing unit 14d continues to determine, based on the information read from the storage unit 13, whether there is a same-net via. When there is a same-net via as a result of the determination, the leading wiring executing unit 14d carries out leading wiring from the component terminal to the same-net via for connection (FIG. 11). In contrast, when there is no same-net via, the leading wiring executing unit 14d continues to determine, based on the information read from the storage unit 13, whether there is an existing leading wire nearby. When there is an existing leading wire nearby as a result of the determination, the leading wiring executing unit 14d arranges vias and carries out leading wiring (see FIG. 12).

Further, where there is no existing leading wire, the leading wiring executing unit 14d continues to determines, based on the information read from the storage unit 13, whether there is an obstacle such as a surface pattern in the wiring direction. When there is an obstacle as a result of the determination, the leading wiring executing unit 14d moves away the obstacle, which exists in the wiring direction, and carries out leading wiring (see FIGS. 13 and 14).

To continue the description above, for those component terminals which are determined, as a result of the determination, as ones whose section is a signal, the leading wiring executing unit 14d determines, based on the information read from the storage unit 13, whether the component terminal is a fixed power supply. When the component terminal is a fixed power supply as a result of the determination, the leading wiring executing unit 14d carries out leading wiring inside the component (see FIG. 15). In contrast, when the component is not a fixed power supply, the leading wiring executing unit 14d determines, based on the information read from the storage unit 13, whether there is a related bypass capacitor nearby. When there is a related bypass capacitor nearby as a result of the determination, the leading wiring executing unit 14d carries out leading wiring from the component terminal to the bypass capacitor terminal for direct connection.

Further, when there is no bypass capacitor nearby, the leading wiring executing unit 14d determines whether the category of the terminal is input/output. When the category of the component terminal is input/output as a result of the determination, the leading wiring executing unit 14d adopts a narrower line width than other leading wiring and determines, similarly to the description above, whether there is a same-net component nearby.

Process of Printed-board Designing Apparatus (Second Embodiment)

Figure 16:
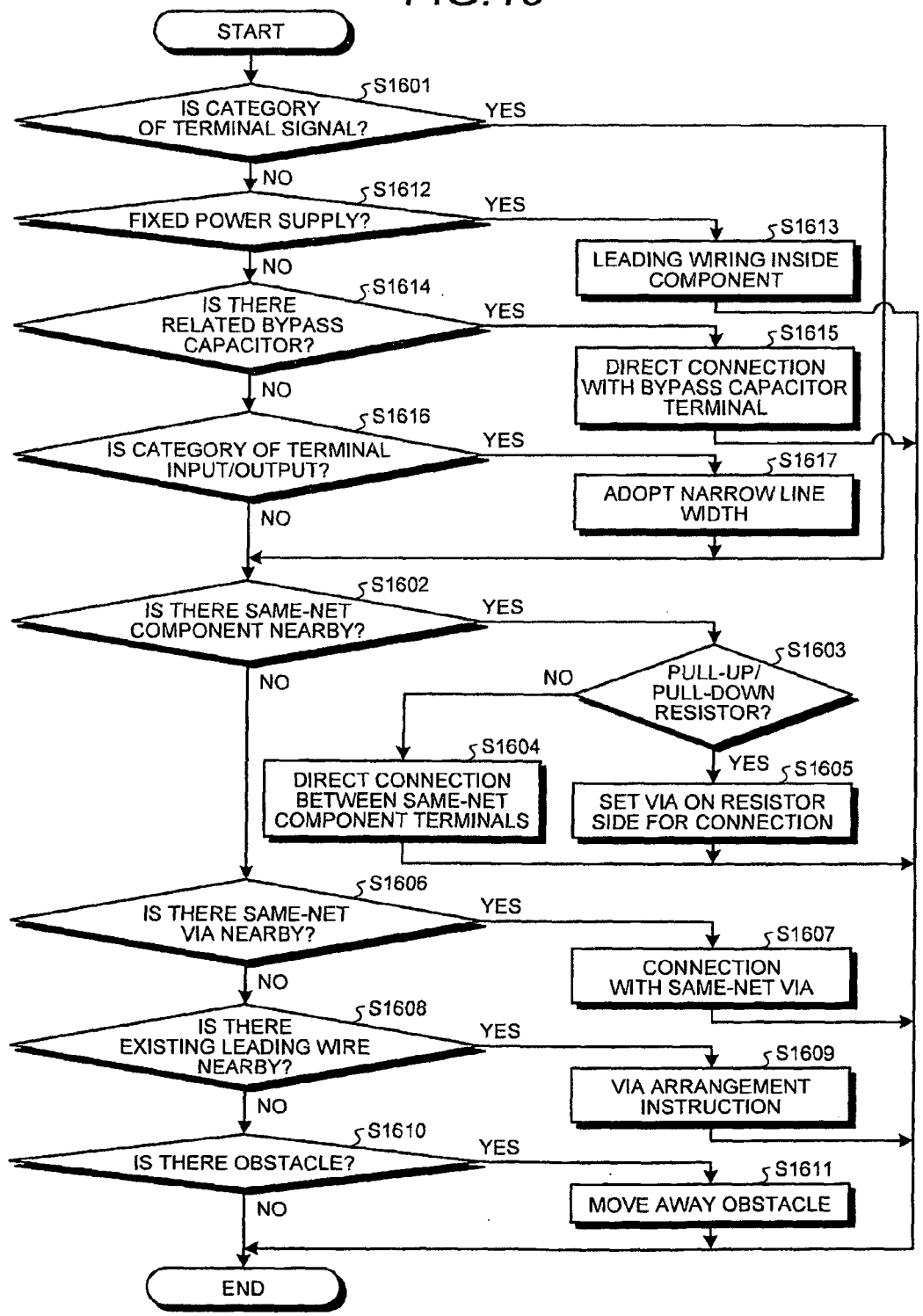
FIG. 16 is a flowchart illustrating a flow of processes of the board designing apparatus in accordance with the second embodiment.

Processes of the board designing apparatus in accordance with the second embodiment are described with reference to FIG. 16. FIG. 16 is a flowchart illustrating a flow of processes of the board designing apparatus in accordance with the second embodiment.

When the determination result indicating that the determination result of the surface-mounted component is a QFP or SOP instead of BGA is received, the leading wiring executing unit 14d reads information stored in the component and terminal information storage unit 13a, the net information storage unit 13b, the restriction condition information storage unit 13c, and the physical information storage unit 13d and then carries out the leading wiring process for each terminal of QFP or SOP as illustrated in FIG. 16.

The leading wiring executing unit 14d determines, based on the information on the terminal attributes read from the component and terminal information storage unit 13a, whether the category of the component terminal of QFP or SOP is signal (Step S1601). When the category is determined as signal as a result of the determination (Step S1601: Yes), the leading wiring executing unit 14d determines, based on the information on the net attributes read from the net information storage unit 13b, whether there is a same-net component near the component terminal whose category is signal (Step S1602).

When there is a of the same-net component nearby (Step S1602: Yes), the leading wiring executing unit 14d determines, based on the information read from the physical information storage unit 13d, whether the component is a pull-up/pull-down resistor (Step S1603). When the component is not a pull-up/pull-down resistor as a result of the determination (Step S1603: No), the leading wiring executing unit 14d carries out leading wiring among the component terminals for direct connection (Step S1604). In contrast, when the component is a pull-up/pull-down resistor (Step S1603: Yes), the leading wiring executing unit 14d sets a via on the resistor side and carries out leading wiring from each component terminal to a via (Step S1605).

Refer back to the description of Step S1602. When there is a same-net component nearby (Step S1602: No), the leading wiring executing unit 14d continues to determine, based on the information read from the storage unit 13, whether there is a same-net via (Step S1606). When there is a same-net via as a result of the determination (Step S1606: Yes), the leading wiring executing unit 14d carries out the leading wiring from the component terminal to the same-net via for connection (Step S1607). In contrast, when there is no same-net via (Step S1606: No), the leading wiring executing unit 14d continues to determine, based on the information read from the storage unit 13, whether there is existing leading wire nearby (Step S1608). When there is an existing leading wire as a result of the determination (Step S1608: Yes), the leading wiring executing unit 14d arranges the vias and carries out the leading wiring (Step S1609).

When there is no exiting leading wiring (Step S1608: No), the leading wiring executing unit 14d continues to determine, based on the information read from the storage unit 13, whether there is an obstacle such as a surface pattern in the wiring direction (Step S1610). When there is an obstacle as a result of the determination (Step S1610: Yes), the leading wiring executing unit 14d moves away the obstacle that is located in the wiring direction and carries out leading wiring (Step S1611).

Refer back to the description of Step S1601. When the category of the component terminal of QFP or SOP is determined as "not signal" as a result of the determination of the category (Step S1601: No), the leading wiring executing unit 14d determines, based on the information read from the storage unit 13, whether the component terminal whose category is determined as "not signal" is a fixed power supply (Step S1612). When the component terminal is a fixed power supply as a result of the determination (Step S1612: Yes), the leading wiring executing unit 14d carries out leading wiring inside the component (Step S1613). In contrast, when the component is not a fixed power supply (Step S1612: No), the leading wiring executing unit 14d determines, based on the information read from the storage unit 13, whether there is a related bypass capacitor nearby (Step S1614). When there is a related bypass capacitor nearby as a result of the determination (Step S1614: Yes), the leading wiring executing unit 14d carries out leading wiring from the component terminal to the bypass capacitor terminal for direct connection (Step S1615).

When there is no related bypass capacitor nearby (Step S1614: No), the leading wiring executing unit 14d determines, based on the information read from the storage unit 13, whether the category of the terminal is input/output (Step S1616). When the category of the component terminal is input/output as a result of the determination (Step S1616: Yes), the leading wiring executing unit 14d adopts a narrower line width than other leading wiring (Step S1617) and determines, similarly to the Step S1602 described above, whether there is a same-net component nearby.

As described above, the second embodiment provides an advantage in that the operation time of leading wiring is shortened considerably.

[c] Third Embodiment

The first and second embodiments, which are merely exemplary embodiments of the present invention, are described above. Other than those embodiments described above, the present invention can be applied differently in various embodiments. Other embodiments within the scope of the present invention are described as other embodiments.

(1) Configurations of Apparatuses

The components of the board designing apparatus 10 illustrated in FIG. 5 are merely functional concepts, and the physical configuration of the components is not necessarily the same as those illustrated. The specific embodiment of disintegration/integration of the board designing apparatus 10 is not limited to the one illustrated. Depending on various kinds of load and operation statuses, all or some of the components may be functionally or physically integrated/disintegrated into an arbitrary unit, for example, the COH usage determining unit 14b and the COH executing unit 14c may be integrated. Further, all or some of the processing functions of the board designing apparatus 10 may be realized with a CPU and programs that are analyzed and executed by the CPU or with hardware based on wired logic.

(2) Board Designing Program

Figure 17:
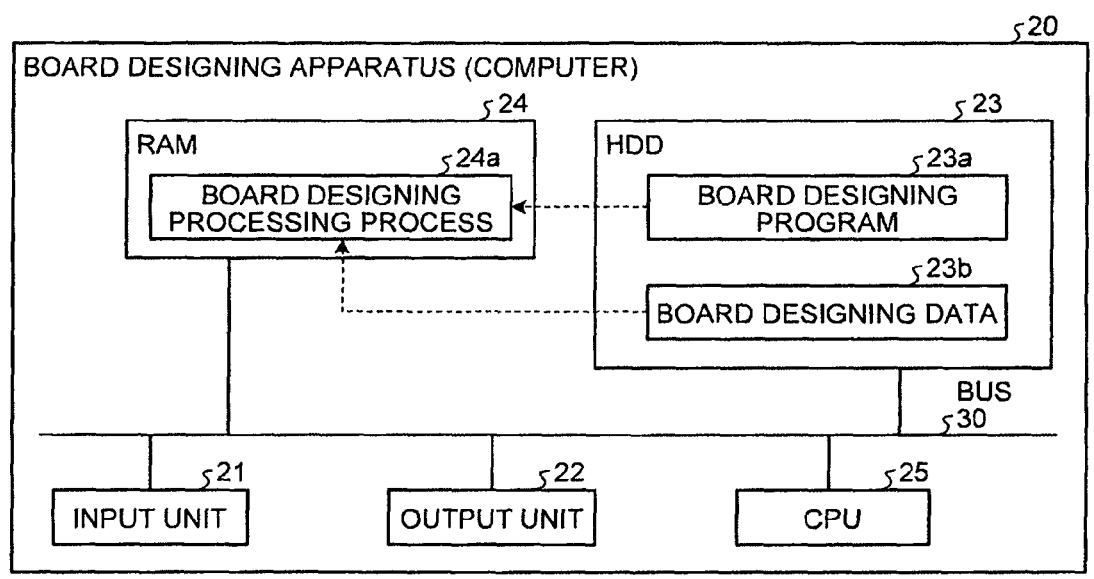
FIG. 17 is a diagram illustrating a computer that executes a printed-board designing program.

Various kinds of processes of the board designing apparatus 10 illustrated in the embodiments described above (e.g., see FIGS. 8 and 16) can be realized by executing prepared programs with a computer system such as a personal computer and a workstation. The following describes an exemplary computer that executes a board designing program that has the same functions as the embodiments above with reference to FIG. 17. FIG. 17 is a diagram illustrating a computer that executes a board designing program.

As illustrated in FIG. 17, a computer 20, which functions as a board designing apparatus, includes an input unit 21, an output unit 22, an HDD 23, a RAM 24, and a CPU 25, which are connected together on a bus 30.

The input unit 21 receives various kinds of data from users. The output unit 22 displays various kinds of information. The HDD 23 stores information needed for carrying out various kinds of processes by the CPU 25. The RAM 24 temporarily stores various kinds of information. The CPU 25 executes various kinds of calculation processes.

As shown in FIG. 17, the HDD 23 previously stores therein a board designing program 23a and a board designing data 23b, which realize the same functions as those of the processing units of the board designing apparatus in the above-mentioned embodiments. The board designing program 23a may be disintegrated as needed and may be stored in a storage unit of a different computer that is connected on a network in an accessible way.

The CPU 25 reads the board designing program 23a from the HDD 23 and extends the board designing program 23a on the RAM 24 so that the board designing program 23a functions as the board designing processing process as illustrated in FIG. 17. A board designing processing process 24a reads the board designing data 23b and the like from the HDD 23 and extends the board designing data 23b on the area of the RAM 24 allocated to itself and carries out various kinds of processes on the basis of the extended data and the like. The board designing processing process 24a corresponds to the control unit 14 (the component shape determining unit 14a, the COH usage determining unit 14b, the COH executing unit 14c, and the leading wiring executing unit 14d) of the board designing apparatus 10 illustrated in FIG. 5.

The board designing program 23a described above may not be always previously stored in the HDD 23. The board designing program 23a may be stored in, for example, a "portable physical medium", which can be inserted into the computer 20, such as a flexible disk (FD), CD-ROM, DVD disk, magnet-optical disk, and IC card. Further, each program may be stored in "other computers (or servers)" that are connected with the computer 20 on public lines, the Internet, LAN, or WAN so that the computer 20 can read and execute the programs therefrom.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A computer-implemented leading wiring method comprising:

determining, based on wiring board information, whether each of surface-mounted components located on a surface of a multilayer printed wiring board has a predetermined shape;

for the surface-mounted components that are determined as having the predetermined shape, identifying a position of each via formed on the multilayer printed wiring board and a position of a footprint of each chip component located on a back surface of the board, and then determining whether each chip component and each surface-mounted component of the predetermined shape can be connected using chip on hole; and for the surface-mounted components and chip components that are determined as ones that can be connected using chip on hole, carrying out leading wiring from the vias, formed leading to the footprint, to terminals of the surface-mounted components so that the terminals of the surface-mounted components and the chip components are connected using chip on hole.

2. The leading wiring method according to claim 1, further comprising
correcting, when receiving from a user a correction instruction for a position of a via formed on the multilayer printed wiring board, the position of the via according to the correction instruction.

3. The leading wiring method according to claim 1, further comprising
after the surface-mounted components and the chip components are connected, determining combinations of leading wiring directions from other vias, which are not used for the connection between the surface-mounted components and the chip components, to the surface-mounted components, and then carrying out leading wiring from the terminals of the surface-mounted components to these other vias according to the determined combinations of the leading wiring directions.

4. The leading wiring method according to claim 1, further comprising
for the surface-mounted components that have a different shape from the predetermined shape of surface-mounted components, carrying out leading wiring for connection depending on categories of terminals.

5. The leading wiring method according to claim 4, further comprising
when the category of the terminal of the surface-mounted component that has a different shape from the predetermined shape of surface-mounted components is signal, carrying out leading wiring directly on same-net terminals for connection.

6. The leading wiring method according to claim 4, further comprising
when the category of the terminal of the surface-mounted component that has a different shape from the predetermined shape of surface-mounted components is a fixed power supply, carrying out leading wiring inside the component for connection.

7. The leading wiring method in accordance with claim 1, further comprising
when the terminal of the surface-mounted component that has a different shape from the predetermined shape of surface-mounted components is to be connected with a termination resistor using leading wiring, connecting the terminal of the surface-mounted component with the termination resistor with a via interposed in between.

8. The leading wiring method according to claim 7, further comprising
when a via is to be formed between the terminal of the surface-mounted component that has a different shape from the predetermined shape of surface-mounted components and a termination resistor, setting a via on the side of the resistor.

9. The leading wiring method according to claim 1, further comprising
when there is a bypass capacitor near the surface-mounted component that has a different shape from the predetermined shape of surface-mounted components, carrying out leading wiring directly from the terminal of the surface-mounted component to the terminal of the bypass capacitor for connection.

10. The leading wiring method according to claim 1, further comprising
when the category of the terminal of the surface-mounted component that has a different shape from the predetermined shape of surface-mounted components is input or input/output, carrying out leading wiring for connection with a narrower line width than a line width of leading wiring led from other terminals.

11. The leading wiring method in accordance with claim 1, further comprising
when there is a same-net via near the surface-mounted component that has a different shape from the predetermined shape of surface-mounted components, carrying out leading wiring directly on the terminal of the surface-mounted component and the via for connection.

12. The leading wiring method according to claim 1, further comprising
when receiving from a user an arrangement instruction of vias, arranging the vias according to the arrangement instruction.

13. The leading wiring method according to claim 1, further comprising
when receiving from a user an obstacle move-away instruction, moving away a component that is determined to be moved away according to the obstacle move-away instruction.

14. A computer readable storage medium having stored therein a program for leading wiring, the program causing a computer to execute a process comprising:
determining, based on wiring board information, whether each of surface-mounted components located on a surface of a multilayer printed wiring board has a predetermined shape;
for the surface-mounted components that are determined as having the predetermined shape, identifying a position of each via formed on the multilayer printed wiring board and a position of a footprint of each chip component located on a back surface of the board, and then determining whether each chip component and each surface-mounted component of the predetermined shape can be connected using chip on hole; and
for the surface-mounted components and chip components that are determined as ones that can be connected using chip on hole, carrying out leading wiring from the vias, formed leading to the footprint, to terminals of the surface-mounted components so that the terminals of the surface-mounted components and the chip components are connected using chip on hole.

15. A leading wiring apparatus comprising:
a shape determining unit that determines, based on wiring board information, whether each of surface-mounted components located on a surface of a multilayer printed wiring board has a predetermined shape;
a connection determining unit that, for the surface-mounted components that are determined as having the predetermined shape, identifies a position of each via formed on the multilayer printed wiring board and a position of a footprint of each chip component located on a back surface of the board, and then determines whether each chip component and each surface-mounted component of the predetermined shape can be connected using chip on hole; and a connection executing unit that, for the surface-mounted components and chip components that are determined as ones that can be connected using chip on hole, carries out leading wiring from the vias, formed leading to the footprint, to terminals of the surface-mounted components so that the terminals of the surface-mounted components and the chip components are connected using chip on hole.

* * * * *